(12) United States Patent
Bagley et al.

(10) Patent No.: US 7,681,452 B2
(45) Date of Patent: Mar. 23, 2010

(54) JUNIOR ULTRASONIC MINIATURE AIR GAP INSPECTION CRAWLER

(75) Inventors: Paul C. Bagley, Middleburgh, NY (US); Richard Hatley, Convent Station, NJ (US); Kenneth Hatley, Madison, NJ (US); Robert M. Roney, Schoharie, NJ (US)

(73) Assignee: General Electric Company, Schenectady, NY (US)

( * ) Notice: Subject to any disclaimer, the term of this patent is extended or adjusted under 35 U.S.C. 154(b) by 574 days.

(21) Appl. No.: 11/306,601

(22) Filed: Jan. 4, 2006

(65) Prior Publication Data

US 2008/0087113 A1   Apr. 17, 2008

(51) Int. Cl.
*A61B 5/04* (2006.01)

(52) U.S. Cl. .................... 73/623; 73/865.8; 73/618

(58) Field of Classification Search .............. 73/1.82, 73/623, 865.8, 588, 598, 618–620; 322/99; 324/220, 545, 722; *G01R 31/06, 31/34*
See application file for complete search history.

(56) References Cited

U.S. PATENT DOCUMENTS

| | | | |
|---|---|---|---|
| 3,602,036 A * | 8/1971 | Peterson | 73/633 |
| 3,930,942 A | 1/1976 | Thome | |
| 4,010,636 A | 3/1977 | Clark et al. | |
| 4,285,242 A * | 8/1981 | Braithwaite | 73/623 |
| 4,285,243 A * | 8/1981 | Collingwood | 73/623 |
| 4,581,938 A | 4/1986 | Wentzell | |
| 4,585,610 A * | 4/1986 | Andersson et al. | 376/249 |
| 4,716,271 A | 12/1987 | Hulsizer et al. | |
| 4,803,563 A | 2/1989 | Dailey et al. | |
| 4,876,672 A | 10/1989 | Petermann et al. | |
| 4,889,000 A | 12/1989 | Jaafar et al. | |
| 5,285,689 A | 2/1994 | Hapstack et al. | |
| 5,408,883 A * | 4/1995 | Clark et al. | 73/601 |
| 5,557,216 A | 9/1996 | Dailey et al. | |
| 5,563,357 A | 10/1996 | Longree | |
| 5,650,579 A | 7/1997 | Hatley et al. | 73/865.8 |
| 5,969,531 A | 10/1999 | Murakami et al. | |
| 6,100,711 A * | 8/2000 | Hatley | 324/772 |
| 6,404,189 B2 | 6/2002 | Kwun et al. | |
| 6,578,424 B1 * | 6/2003 | Ziola et al. | 73/632 |
| 6,672,413 B2 | 1/2004 | Moore et al. | |

(Continued)

FOREIGN PATENT DOCUMENTS

JP       61160090       7/1996

(Continued)

OTHER PUBLICATIONS

Disclosure Statement Under 37 C.F.R. 1.56, filed Apr. 7, 2009.

(Continued)

*Primary Examiner*—Hezron Williams
*Assistant Examiner*—Samir M Shah
(74) *Attorney, Agent, or Firm*—Sutherland Asbill & Brennan LLP

(57) ABSTRACT

An inspection head for an air gap inspection device. The inspection head may include a pair of expandable shoes, an inspection device attached to the pair of shoes, and a transducer assembly attached to one of the pair of shoes.

18 Claims, 7 Drawing Sheets

U.S. PATENT DOCUMENTS

| | | |
|---|---|---|
| 6,883,386 B2 * | 4/2005 | Osone et al. .............. 73/861.25 |
| 6,888,143 B2 * | 5/2005 | Vogt et al. ................ 250/341.1 |
| 6,889,783 B1 | 5/2005 | Moore et al. |
| 6,959,603 B2 | 11/2005 | Knight et al. |
| 7,077,020 B2 | 7/2006 | Langley et al. |
| 7,201,055 B1 | 4/2007 | Bagley et al. |
| 7,249,512 B2 | 7/2007 | Kennedy et al. |
| 2002/0017140 A1 * | 2/2002 | Georgeson et al. ............ 73/618 |
| 2002/0074965 A1 * | 6/2002 | Hatley et al. ........... 318/568.12 |
| 2008/0196504 A1 * | 8/2008 | Johnson et al. ................ 73/588 |
| 2009/0000379 A1 * | 1/2009 | Rath et al. .................... 73/592 |

FOREIGN PATENT DOCUMENTS

| | | | |
|---|---|---|---|
| JP | 2002209363 A * | 7/2002 | ................ 73/865.8 |

OTHER PUBLICATIONS

Notice of Allowance and Fee(s) Due, for U.S. Appl. No. 11/420,863, mailed Apr. 17, 2009.

* cited by examiner

JUNIOR ULTRASONIC MINIATURE AIR GAP INSPECTION CRAWLER

TECHNICAL FIELD

The present invention relates generally to a miniature robotic device and more particularly relates to a miniature robotic device for performing in-situ ultrasonic inspections of a generator field.

BACKGROUND OF THE INVENTION

The visual inspection of a generator field and stator should be performed on a periodic basis. Conventional generator/stator inspection and testing procedures typically require the complete disassembly of the stator and the removal of the generator field from the stator before any inspections or tests can be performed on the unit. The cost of the disassembly and the removal of the field, the time it takes for this process, and the dangers of field removal have led to the occasional omission of the generator and stator examinations from outage schedules.

In-situ inspections of generators have been performed employing poles, trolleys, and field turning techniques. These procedures have not accomplished the inspection task in a satisfactory manner.

Miniature air gap inspection crawlers are disclosed in commonly owned U.S. Pat. Nos. 5,650,579 and 6,100,711, the contents of which are hereby incorporated by reference. These crawlers are designed to pass through the radial air gap between the core iron and the retaining ring for in-situ inspection of the field and stator core.

Video cameras and other inspection tools attached to the crawler may be used to perform generator field and stator core inspections. For example, a high-resolution video camera provides the operator with a clear view of the stator core laminations, stator wedges, field wedges, and the in-board ends of the retaining rings. The device thus provides detection capability for loose stator wedges, vibration bar sparking, core lamination damage due to foreign objects, motoring and hot spots, field wedge arcing, and surface heating damage. Through the generator in-situ inspection, information is gathered on the condition of the generator that can help determine if field removal is necessary.

Although these known devices are adequate for visual inspection, these visual systems cannot detect internal defects such as cracks or pits in the field teeth. Rather, such cracks can only be found by ultrasonic inspection. Currently, however, the rotor must be pulled out of the stator before an ultrasonic inspection can be performed.

There is a desire therefore for a device and method to perform in-situ ultrasonic inspection of a generator stator and field. The device preferably should be sized to pass through the radial air gap.

SUMMARY OF THE INVENTION

The present application thus describes an inspection head for an air gap inspection device. The inspection head may include a pair of expandable shoes, an inspection device attached to the pair of shoes, and a transducer assembly attached to one of the pair of shoes.

The transducer assembly may include an ultrasonic transducer. The ultrasonic transducer may be attached to the base by a number of arms. The arms may include a lever arm and a straight arm. The transducer assembly also may include a motor thread connected to the lever arm. The transducer assembly may include an ultrasonic transducer and the transducer assembly may include means for pivoting the ultrasonic transducer. The inspection device may include a camera or a number of cameras.

The present application further describes an inspection head for an air gap inspection device. The inspection head may include a pair of expandable shoes, an inspection device attached to the pair of shoes, an ultrasonic transducer, and the ultrasonic transducer may be attached to one of the pair of shoes via a pivot assembly.

The pivot assembly may include a base and the ultrasonic transducer may be attached to the base by a number of arms. The arms may include a lever arm and a straight arm. The pivot assembly may include a motor thread connected to the lever arm. The inspection device may include a camera or a number of cameras.

These and other features of the present invention will become apparent to one of ordinary skill in the art upon review of the following detailed description when taken in conjunction with the drawings and the appended claims.

DETAILED DESCRIPTION

Figure 1:
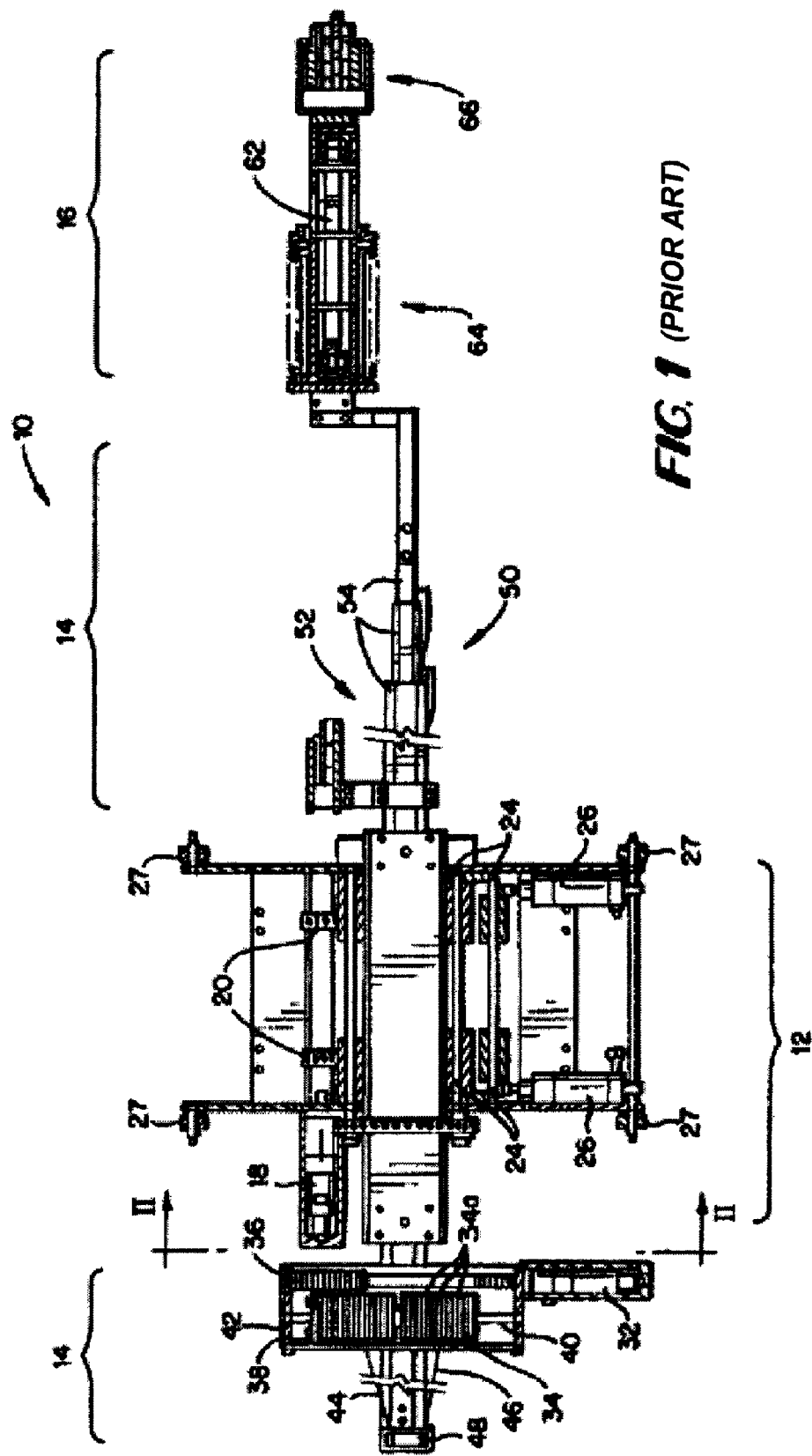
FIG. 1 is a top plan view of the miniature air gap inspection device.

FIG. 1 is a top plan view of a miniature air gap inspection device 10. Generally described, the device 10 includes a tractor section 12, a mast section 14, and an inspection head 16. The tractor section 12 is controlled to circumferentially position the device 10 about the field. The mast section 14 is attached to the tractor section 12 and serves to position the inspection head 16 axially in the air gap. The inspection head 16 is attached for axial movement with the mast section 14 and supports at least one inspection tool.

Figure 2:
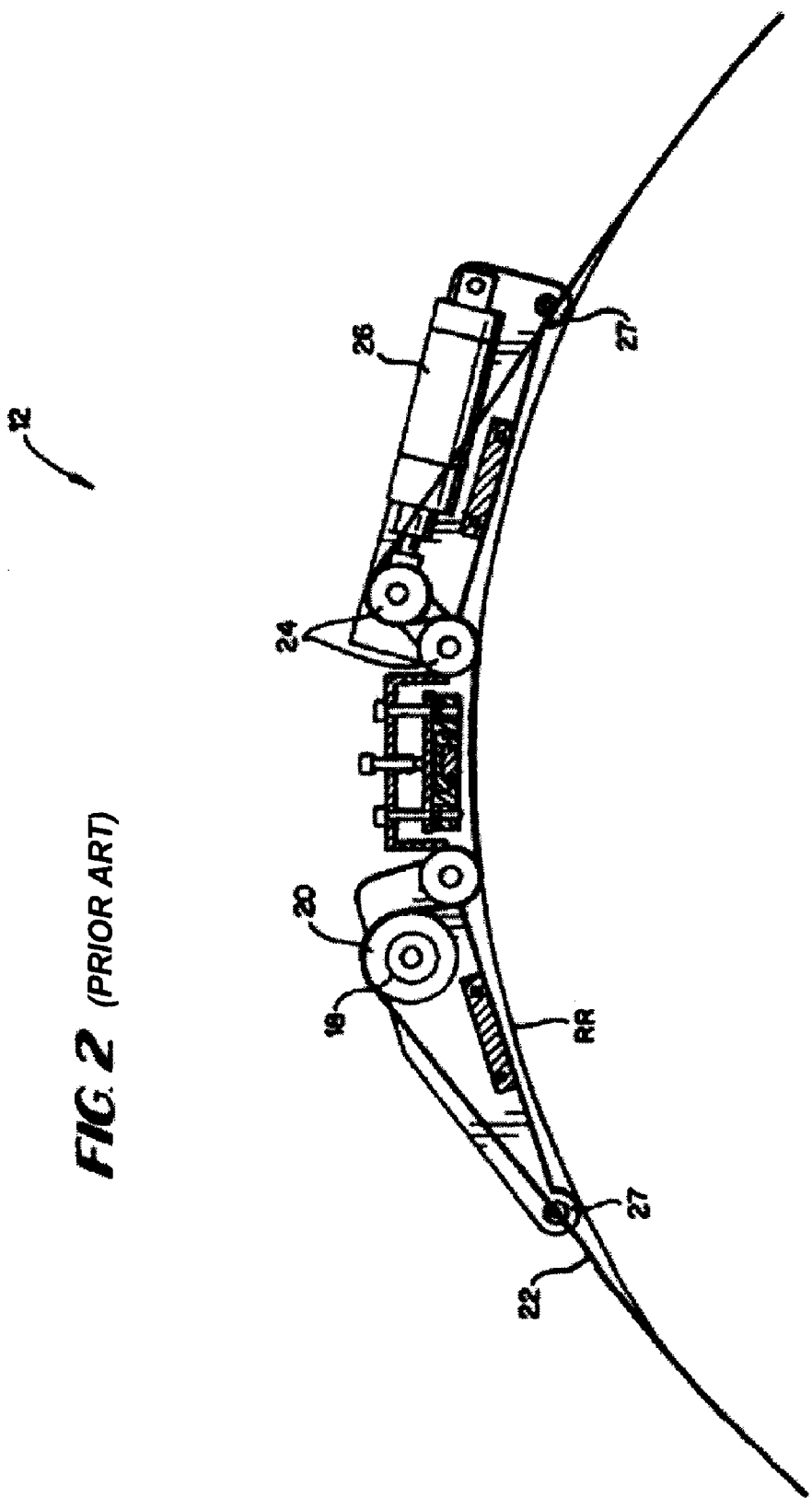
FIG. 2 is a side view of the tractor section of the device of FIG. 1.

FIG. 2 is a side view of the tractor section 12 along the line II-II in FIG. 1. The tractor section 12 uses a DC motor 18 that transfers power to two joined drive gears 20. The drive gears 20 roll along tracks 22 in a circumferential direction around a retaining ring RR. Slack in the drive tracks 22 is removed by routing the tracks 22 over two idle pulleys 24, respectively. The pulleys 24 are positioned at the end of two pneumatic air rams 26, respectively. The air rams 26 are activated via pressurized air, and the rams 26 push the pulleys 24 against the tracks 22. The tractor section 12 is carried by wheels 27 as it is driven circumferentially about the retaining ring RR.

Clockwise and counterclockwise motion of the device along the tracks 22 and circumferential speed about the retaining ring is controlled by the operator at a control panel (not shown). The control panel has a series of switches and displays that help the operator control the air pressure for the track tensioners and the circumferential position of the device.

Figure 3:
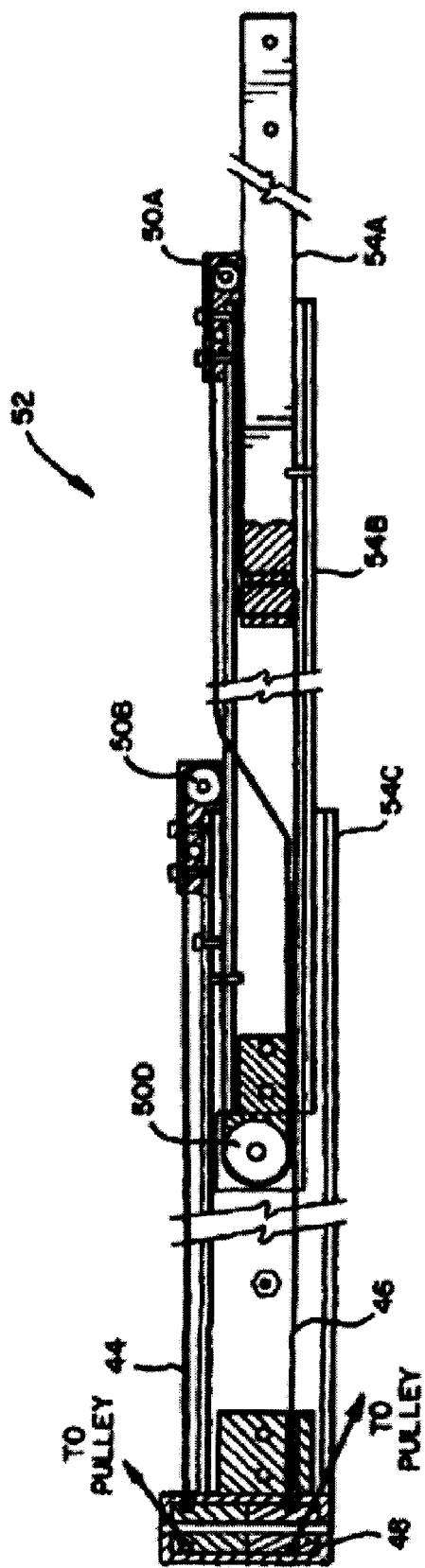
FIG. 3 is a sectional view of the mast section of the device of FIG. 1.

With reference to FIG. 3 and continued reference to FIG. 1, the mast section 14 utilizes a DC motor 32 that transfers power to a split threaded tensioning drum 34 via a drive gear 36 engaging an idler gear 38 attached at one end of the drum 34. The drum 34 is rotated on a threaded axle 40 mounted in a frame 42 such that the drum 34 moves side to side within the frame 42 at a rate determined by the pitch of the threaded axle 40. A pair of cables 44, 46 are wound and unwound on the drum 34 in grooves 34a formed on the drum 34. The grooves 34a are spaced at a pitch corresponding to the pitch of the threaded axle 40 so that the cables 44, 46 are wound in the grooves 34a of the drum 34, and overlapping of the cables 44, 46 is prevented.

One of the cables, e.g., cable 44, is wound over the drum 34 while the other of the cables, e.g., cable 46, is wound under the drum 34. As such, while winding the drum 34 in either direction, one of the cables 44, 46 is driving the mast while the other is idle. In this context, as the drum turns in one direction, one of the cables rolls off the drum as the other of the cables rolls on the drum. The cables 44, 46 extend over a first pulley 48 to a pulley system 50 that drives an extendible mast 52. The mast 52 may include a number of telescoping sections 54, preferably three flat rods that slide within one another allowing the mast 52 to become longer and shorter. As the drum 34 is driven in a first direction, the first cable 44 extends the mast 52 in an axial direction along the generator. Reversing the motor causes the second cable 46 to retract the mast 52.

FIG. 3 is a sectional view through the mast. The mast sections include a first section 54A that telescopes within a second section 54B. The first cable 44 comes from the tensioning drum 34 around the first pulley 48 and then travels a serpentine route around pulleys 50B, 50D and 50A and is then attached to an end of the first section 54A. The second cable 46 extends directly from the end of the first section 54A around pulley 48 to the tensioning drum 34. Other configurations of the pulley system 50 may be contemplated, and the invention is not meant to be limited to the disclosed arrangement.

Figure 4:
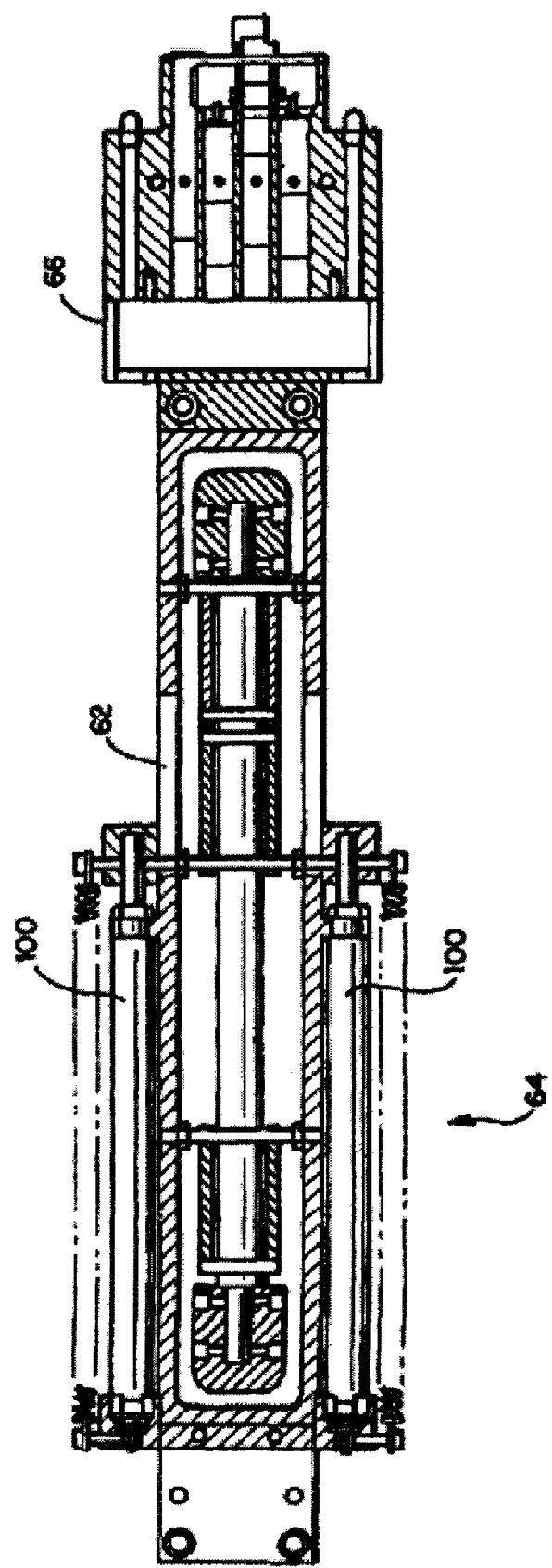
FIG. 4 is a plan view of the inspection head of the device of FIG. 1.
Figure 4A:
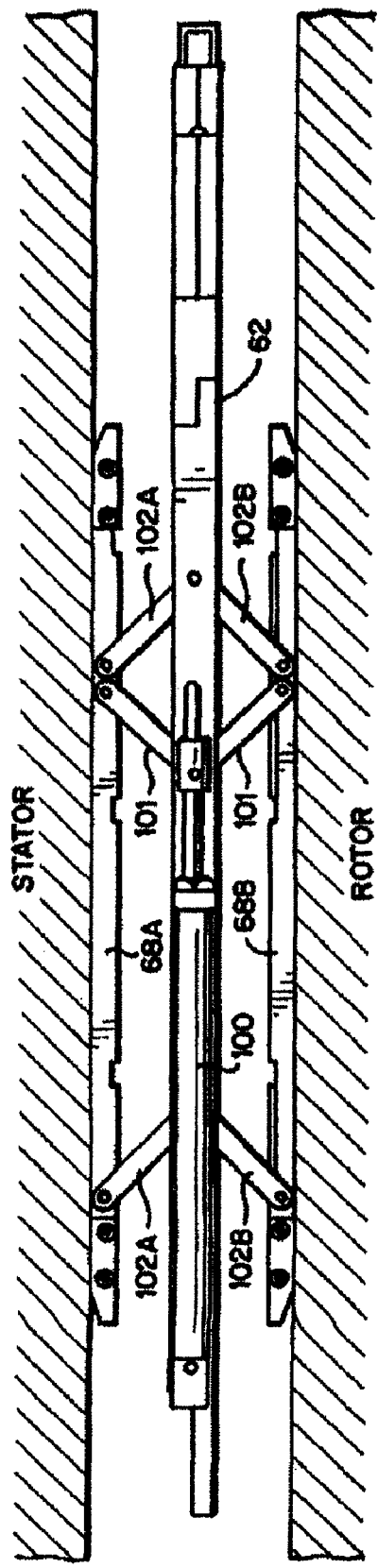
FIG. 4A is a side view of the inspection head of the device of FIG. 1.

FIG. 4 is a plan view of the inspection head according to the present invention, and FIG. 4A is a side view of the inspection head. The inspection head 16 is attached to the mast section 14, and more particularly to one of the telescoping rods 54, and moves axially with the extension and retraction of the mast 52. The inspection head 16 includes a central support member or inspection head base 62 supporting a sled 64 and a camera assembly 66.

The sled 64 may include two shoes 68A, 68B that are expandable and contractable by any suitable structure such as gears and levers or the like. Preferably, the shoes 68A, 68B sit flat together in the center of the inspection head 16 and are attached to two pneumatic spring return air rams 100 acting on links 101. When air is applied to the pneumatic rams 100, the shoes 68A, 68B separate to expand the sled 64 with one shoe coming in contact with the generator field, and the other extending into the stator slots. Links 102A are arranged parallel to each other so that the shoe 68A expands parallel to the central support member 62. Similarly, links 102B cause shoe 68B to expand parallel to the central support member 62. In a fully contracted position, the inspection head is sized to fit into a 0.5 inch (about 12.7 millimeters) gap. The shoes 68A, 68B serve to stabilize the inspection tool(s) in the gap and center the camera assembly 66. The camera assembly 66 is attached to the central support member 62 at a position that is axially forward of the sled 64.

With the shoes 68A, 68B expanded, axial movement can be initiated to begin the inspection. At least the shoe on the field side of the sled 64 is coated with Teflon or the like to facilitate sliding of the expanded sled in the gap.

When the gap has been completely inspected, the mast 52 is retracted to return the inspection head 16 to its starting position, the shoes 68A, 68B of the sled 64 are contracted, and the inspection head 16 is moved circumferentially to the next slot by the tractor section 12. The process is then repeated until all slots have been inspected.

Similar to the camera assembly disclosed in the above-noted '579 patent, the camera assembly 66 contains a forward view camera of fixed focus used for navigation and detection and a variable view camera with a power focus assembly and a right angle prism to allow for viewing of stator and rotor surfaces. The details of the camera are not pertinent to the present application and will not be further described. Other types of inspection devices may be used herein.

Figure 5:
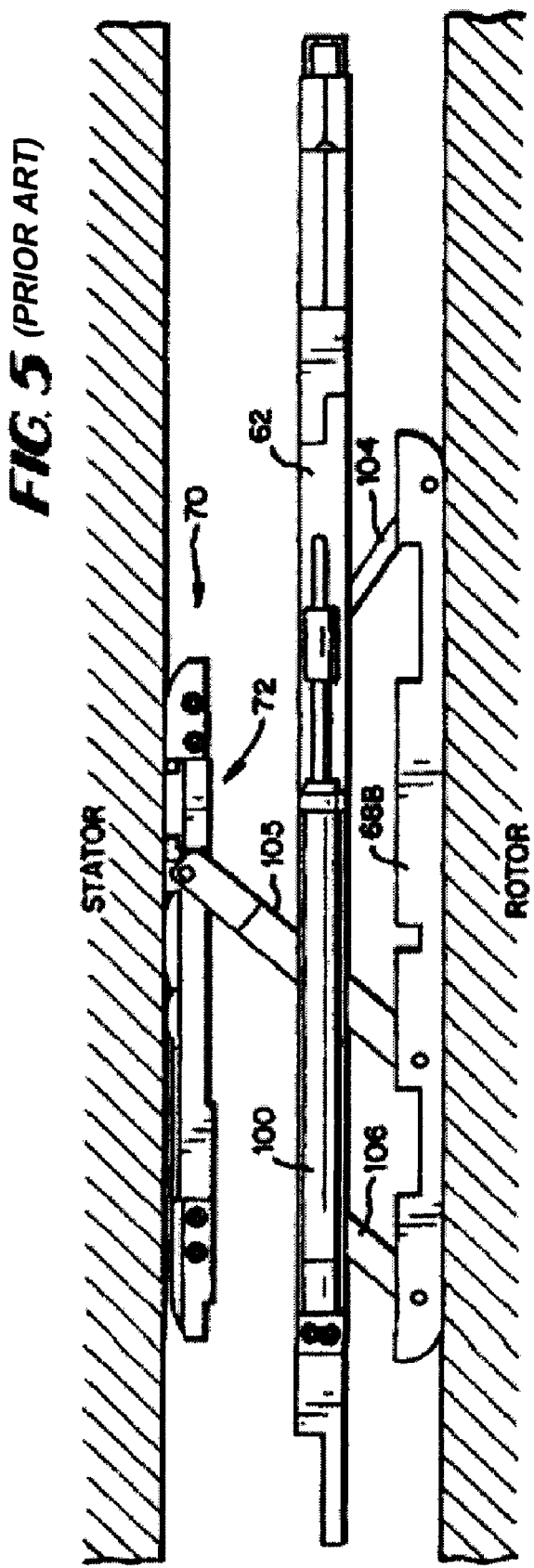
FIG. 5 shows an auxiliary shoe of the inspection head of FIG. 1.

When wedge tightness inspections are performed, a separate shoe assembly is used that includes a wedge tapping module. FIG. 5 illustrates the sled 64 with an auxiliary shoe 70 including a wedge tapping module 72. The auxiliary shoe 70 replaces the stator side shoe 68A. The auxiliary shoe 70 is thus structured to stabilize the sled 64 and center the camera assembly 66 in the same manner as the shoe 68A. The link mechanism in this arrangement may be different, however, to enable the wedge tapping module to align against the wedge. In this configuration, air rams 100 act on a link 104, which in turn causes the shoe 68B to rotate links 105, 106. The links 105, 106 remain parallel with each other causing the shoe 68B to remain parallel with the central support member 62. The wedge tapping module is pivotally mounted to the link 105. The wedge tapping module 72 is conventional, and the details and operation thereof will not be further described. With this structure, the inspector can perform the visual inspection and wedge tapping test simultaneously as the sled and camera assembly are moved axially down the slot, stopping at each wedge to perform the tightness test.

The inspection head 16 may alternatively or additionally carry an ELCID coil for inspecting shorted stator punchings. The ELCID coil is conventional and will not be further described. Those of ordinary skill in the art will appreciate that alternative inspection tools may also be supported by the inspection head, and the invention is not meant to be limited to the disclosed embodiments.

The miniature air gap inspection device according to the present application permits in-situ inspection of the generator field and stator core with entrance gaps of as little as 0.5 inches (about 12.7 millimeters) and larger. The inspection can be performed without rotation of the generator field, and valuable information can be gathered on the generator condition without requiring removal of the field. As noted, the inspection device is also designed to carry an auxiliary inspection tool such as a wedge tapping device and/or an ELCID coil for measuring the tightness of stator slot wedges and for inspection of shorted stator punchings, respectively.

Figure 6:
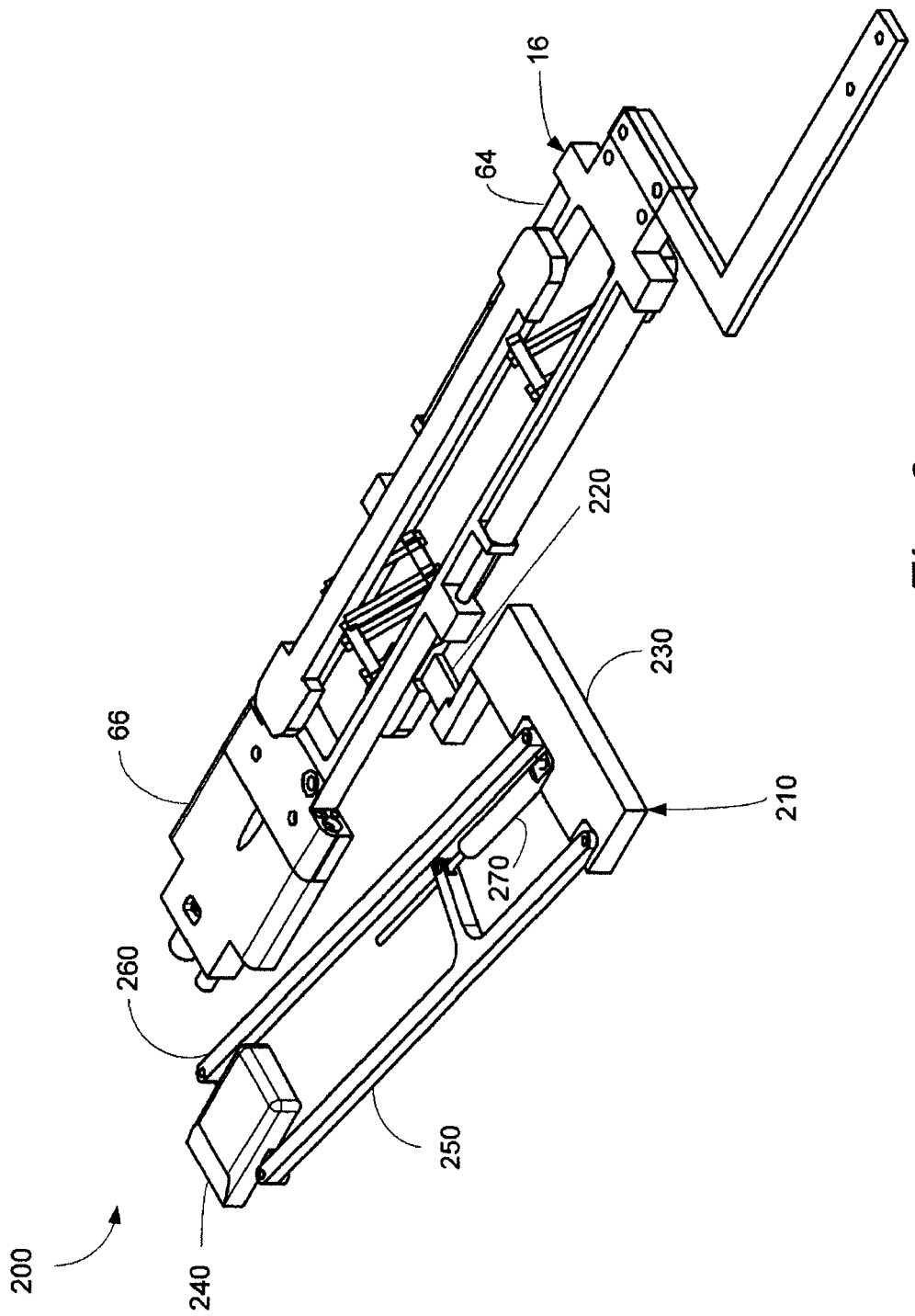
FIG. 6 is a perspective view of a miniature air gap inspection device with an ultrasonic module as is described herein.

FIG. 6 shows a further embodiment, an inspection head 200 for use with a miniature air gap inspection device 10 as is described herein. The inspection head 200 is largely similar to the inspection head 16 as is described in detail above with the addition of a transducer assembly 210 attached to the sled 64. The transducer assembly 210 may be attached to the first or second shoe 68A, 68B via a connector plate 220. The connector plate 220 leads to a base 230. As is shown, a transducer head 240 may be attached to the base 230 via a number of arms, a lever arm 250 and a straight arm 260. The lever arm 250 also may be connected to a motor thread 270. The motor thread 270 may have a conventional DC motor therein so as to rotate the thread. Other types of drive devices may be used herein. The arms 250, 260 and the motor thread 270 may be pivotably attached to the base 230. The direction of the transducer head 240 may be altered via the motor thread 270 driving the lever arm 250. The transducer head 240 thus is capable of pivoting about the transducer assembly 210 as a whole.

The transducer head 240 may include an ultrasonic transducer of conventional design. The transducer head 240 may detect cracks as small as 0.025 inches (about 0.635 millimeters). The transducer assembly 210 also may have means for spreading couplant before the transducer head 240 and/or a means to vacuum the couplant after use. The couplant can be any desired fluid, including water. Any other type of inspection means also may be used herein.

It should be apparent that the foregoing relates only to the preferred embodiments of the present invention and that numerous changes and modifications may be made herein by one of ordinary skill in the art without departing from the general spirit and scope of the invention as defined by the following claims and the equivalents thereof.

What is claimed is:

1. An inspection head for an air gap inspection device, comprising:
    a pair of expandable shoes;
    an inspection device attached to the pair of shoes; and
    a transducer assembly attached to one of the pair of shoes,
       the transducer assembly comprising:
       a base,
       a plurality of arms, each pivotably attached directly to the base,
       a transducer head attached directly to each of the plurality of arms, and
       a motor thread operable to drive at least one of the arms so as to alter a direction of the transducer head.

2. The inspection head of claim 1, wherein the transducer head comprises an ultrasonic transducer.

3. The inspection head of claim 1, wherein the plurality of arms comprises a lever arm and a straight arm.

4. The inspection head of claim 3, wherein the motor thread is connected to the lever arm.

5. The inspection head of claim 1, wherein the transducer assembly comprises an ultrasonic transducer.

6. The inspection head of claim 1, wherein the inspection device comprises a camera.

7. The inspection head of claim 1, wherein the inspection device comprises a plurality of cameras.

8. The inspection head of claim 1, wherein the transducer assembly further comprises a connector plate that attaches the base to one of the pair of shoes.

9. The inspection head of claim 1, wherein the motor thread comprises a DC motor.

10. The inspection head of claim 1, wherein the plurality of arms and the motor thread are pivotably attached to the base.

11. The inspection head of claim 1, wherein the transducer head is configured to pivot about the transducer assembly as a whole.

12. An inspection head for an air gap inspection device, comprising:
    a pair of expandable shoes;
    an inspection device attached to the pair of shoes; and
    a transducer assembly comprising:
       a base,
       a plurality of arms, each arm pivotably directly attached to the base,
       an ultrasonic transducer attached directly to each of the plurality of arms, and
       means for driving at least one of the arms to pivot the ultrasonic transducer about the transducer assembly.

13. The inspection head of claim 12, wherein the plurality of arms comprises a lever arm and a straight arm.

14. The inspection head of claim 13, wherein the means for driving at least one of the arms comprises a motor thread connected to the lever arm.

15. The inspection head of claim 14, wherein the motor thread comprises a DC motor.

16. The inspection head of claim 12, wherein the inspection device comprises a camera.

17. The inspection head of claim 12, wherein the inspection device comprises a plurality of cameras.

18. The inspection head of claim 12, wherein the transducer assembly further comprises a connector plate that attaches the base to one of the pair of shoes.

* * * * *